(12) United States Patent
Hao

(10) Patent No.: US 10,656,486 B2
(45) Date of Patent: May 19, 2020

(54) DISPLAY PANEL AND DISPLAY DEVICE

(71) Applicants: Boe Technology Group Co., Ltd., Beijing (CN); Beijing Boe Optoelectronics Technology Co., Ltd., Beijing (CN)

(72) Inventor: Jingang Hao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 578 days.

(21) Appl. No.: 15/505,968

(22) PCT Filed: Aug. 4, 2016

(86) PCT No.: PCT/CN2016/093231
§ 371 (c)(1),
(2) Date: Feb. 23, 2017

(87) PCT Pub. No.: WO2017/076083
PCT Pub. Date: May 11, 2017

(65) Prior Publication Data
US 2019/0257875 A1  Aug. 22, 2019

(30) Foreign Application Priority Data

Nov. 6, 2015  (CN) .......................... 2015 1 0751032

(51) Int. Cl.
*G02F 1/1362* (2006.01)
*H01L 27/12* (2006.01)

(52) U.S. Cl.
CPC .. *G02F 1/136286* (2013.01); *G02F 1/136204* (2013.01); *H01L 27/124* (2013.01);
(Continued)

(58) Field of Classification Search
CPC ............. H01L 27/0248; H01L 27/0296; H01L 27/124; G01R 31/2644; G02F 1/136204;
(Continued)

(56) References Cited

U.S. PATENT DOCUMENTS

2006/0050194 A1  3/2006  Lee et al.
2006/0077162 A1*  4/2006  Chou ................. G02F 1/136204
                                                         345/92
(Continued)

FOREIGN PATENT DOCUMENTS

CN        1746729      3/2006
CN      101004490      7/2007
(Continued)

OTHER PUBLICATIONS

International Search Report for PCT/CN2016/093231 dated Nov. 10, 2016.
(Continued)

*Primary Examiner* — Jia X Pan
(74) *Attorney, Agent, or Firm* — Calfee, Halter & Griswold LLP

(57) ABSTRACT

Disclosed is a display panel, comprising a signal line, a test line for testing a signal line of the signal line, and a dummy line. The dummy line extends in a direction substantially consistent with that of the test line for preventing occurrence of electrostatic discharge on the test line. The test line and the dummy line have an overlapping region with the signal line, respectively, and the ratio of the area of the overlapping region between the dummy line and the signal line to the area of the dummy line is smaller than the ratio of the area of the overlapping region between the test line and the signal line to the area of the test line. A display device comprising the display panel is further disclosed.

18 Claims, 3 Drawing Sheets

(52) U.S. Cl.
CPC ............ *G02F 2001/136254* (2013.01); *G02F 2001/136272* (2013.01); *G09G 2300/0413* (2013.01); *G09G 2300/0426* (2013.01)

(58) Field of Classification Search
CPC ..... G02F 2202/22; G02F 2001/136254; G02F 2001/136272; G02F 1/136286; G09G 3/006; G09G 2300/0413; G09G 2300/0426

See application file for complete search history.

(56) References Cited

U.S. PATENT DOCUMENTS

| | | | |
|---|---|---|---|
| 2008/0204618 A1* | 8/2008 | Jung | G02F 1/13452 349/40 |
| 2009/0091673 A1 | 4/2009 | Chen et al. | |
| 2009/0231255 A1* | 9/2009 | Tanimoto | G02F 1/136286 345/87 |
| 2013/0048362 A1 | 2/2013 | Kuroda | |
| 2014/0319528 A1 | 10/2014 | Kesho et al. | |
| 2016/0064413 A1 | 3/2016 | Cai et al. | |

FOREIGN PATENT DOCUMENTS

| | | |
|---|---|---|
| CN | 101004490 A | 7/2007 |
| CN | 102654699 A | 9/2012 |
| CN | 103474418 A | 12/2013 |
| CN | 103941440 | 7/2014 |
| CN | 104122687 A | 10/2014 |
| CN | 104218042 A | 12/2014 |
| CN | 105243981 | 1/2016 |
| CN | 205177379 | 4/2016 |
| CN | 205177379 U | 4/2016 |
| TW | 200901428 | 1/2009 |

OTHER PUBLICATIONS

First Office Action for Chinese Patent Application No. 201510751032.X dated Jun. 2, 2017.

Second Office Action for Chinese Patent Application No. 201510751032.X dated Sep. 26, 2017.

* cited by examiner

DISPLAY PANEL AND DISPLAY DEVICE

RELATED APPLICATION

The present application is the U.S. national phase entry of PCT/CN2016/093231, with an international filing date of Aug. 4, 2016, which claims the benefit of Chinese Patent Applications No. 201510751032.X, filed on Nov. 6, 2015, the entire disclosures of which are incorporated herein by reference.

FIELD

The present disclosure generally relates to the field of display, and more particularly to a display panel and a display device comprising the display panel.

BACKGROUND

In the course of manufacturing a display panel, a test line is typically designed in the display panel. The test line is a line reserved for the development or research personnel to test signals in the display panel. This line is only dedicated to the development or research personnel, whereas it does not function when the user uses the display panel normally.

However, in practical use, the test line may also have a negative impact on the normal operation of the display panel. An electrostatic discharge (ESD) phenomenon occurs at positions where the test line overlaps other signal lines in the display panel. The electrostatic discharge on the test line would cause the signal lines connected to the test line to show line fault in the display panel.

At present, the electrostatic discharge problem of the display panel is mainly solved by: (1) deploying an electrostatic protection circuit in the display panel, which is usually electrically connected to the signal line in the display panel; (2) maintaining the display panel by a maintenance staff when the user encounters the electrostatic discharge problem in use, and removing the part that causes electrostatic discharge. However, a separate electrostatic protection circuit needs to occupy more wiring space within the display panel, which is disadvantageous to thinning and portability of the display panel, and increases the wiring complexity and the manufacturing cost. On the other hand, the maintenance does not fundamentally solve the electrostatic discharge problem, and not only leads to additional consumption of human and material resources, but also degrades the user experience.

In view of the above, there is a need for improved display panel and display device.

SUMMARY

It is an object of the present disclosure to provide a display panel and a display device comprising the display panel, which can at least partially alleviate or eliminate one or more of the above-mentioned problems in the prior art.

According to an aspect of the present disclosure, there is provided a display panel, which may comprise a signal line, a test line for testing a signal of the signal line, and a dummy line. The dummy line extends in a direction substantially consistent with that of the test line for preventing occurrence of electrostatic discharge on the test line. The test line and the dummy line have an overlapping region with the signal line, respectively, and the ratio of an area of the overlapping region between the dummy line and the signal line to an area of the dummy line is smaller than the ratio of an area of the overlapping region between the test line and the signal line to an area of the test line.

As used herein, the term "dummy line" refers to a line which extends in a direction substantially consistent with that of the test line and does not actually function during testing and normal display. Preferably, the dummy line is substantially parallel to and substantially similar in shape to the test line. The effect of the dummy line is to enable the electrostatic discharge to occur on the dummy line rather than on the test line, thereby preventing poor display of the display panel resulting from the electrostatic discharge on the test line. It has been discovered that, for two substantially parallel dummy lines, the electrostatic discharge takes place preferentially on the line where the ratio of the area of the overlapping region thereof with the signal line to the line area is smaller. In particular, for two substantially parallel dummy lines, the electrostatic discharge takes place preferentially on the line with larger trace area; for two dummy lines which are substantially parallel and have substantially equal areas, the electrostatic discharge takes place preferentially on the line whose overlapping region with the signal line has smaller area.

Through embodiments of the present disclosure, not only the function of the test line can be retained, but also the problem of electrostatic discharge on the test line can be solved, reducing the yield loss and the maintenance cost of the display panel. Meanwhile, by adding the design of a dummy line while designing the wiring mask of the display panel, it is possible to solve the problem of electrostatic discharge on the test line without increasing the manufacturing complexity and the manufacturing cost, as compared with the solution of deploying a separate electrostatic protection circuit, which is advantageous to thinning and portability of the display panel.

According to an embodiment of the present disclosure, the ratio of the area of the overlapping region between the dummy line and the signal line to the area of the dummy line may be at least 15% smaller than the ratio of the area of the overlapping region between the test line and the signal line to the area of the test line. For example, the ratio of the area of the overlapping region between the dummy line and the signal line to the area of the dummy line may be 20% smaller than the ratio of the area of the overlapping region between the test line and the signal line to the area of the test line.

According to another embodiment of the present disclosure, the area of the dummy line may be larger than or equal to the area of the test line, and an overlapping area between the dummy line and the signal line is smaller than an overlapping area between the test line and the signal line. For example, the overlapping area between the dummy line and the signal line may be at least 15% (e.g. 20%) smaller than the overlapping area between the test line and the signal line.

According to a further embodiment, the width of the dummy line in the overlapping region thereof with the signal line may be smaller than the width of the test line in the overlapping region thereof with the signal line, and the width of the dummy line in regions other than the overlapping region may be larger than or equal to that of the test line. At that time, the dummy line may be equal in length to the test line.

According to yet another embodiment, the area of the overlapping region between the dummy line and the signal line may be smaller than or equal to the area of the overlapping region between the test line and the signal line, and the area of the dummy line may be larger than the area of the test line.

According to a further embodiment, the width of the dummy line may be equal to that of the test line, and the length of the dummy line may be larger than that of the test line. For example, the length of the dummy line may be at least 15% larger than that of the test line. In the above embodiments, the signal line may be a gate line and/or a data line.

According to another aspect of the present disclosure, there is provided a display device, which may comprise the display panel described in any of the above embodiments.

The above display device has embodiments and advantages corresponding to or similar to those of the display panel according to the present disclosure, and will not be described again.

BRIEF DESCRIPTION OF DRAWINGS

These and other aspects of the present disclosure will now be described in more detail with reference to the accompanying drawings that illustrate embodiments of the present disclosure, wherein the drawings are not necessarily drawn to scale, but focus on illustrating the principle of the present disclosure. In addition, elements known to those skilled in the art are omitted from the drawings so as not to obscure the present disclosure. In the drawings.

DETAILED DESCRIPTION

The present disclosure will now be described more comprehensively below with reference to the accompanying drawings, in which embodiments of the present disclosure are shown. The present disclosure, however, may be embodied in many different forms and should not be construed as being limited to the embodiments set forth herein; rather, these embodiments are provided for completeness and thoroughness and to provide a thorough understanding of the scope of the present disclosure to those skilled in the art.

Figure 1:
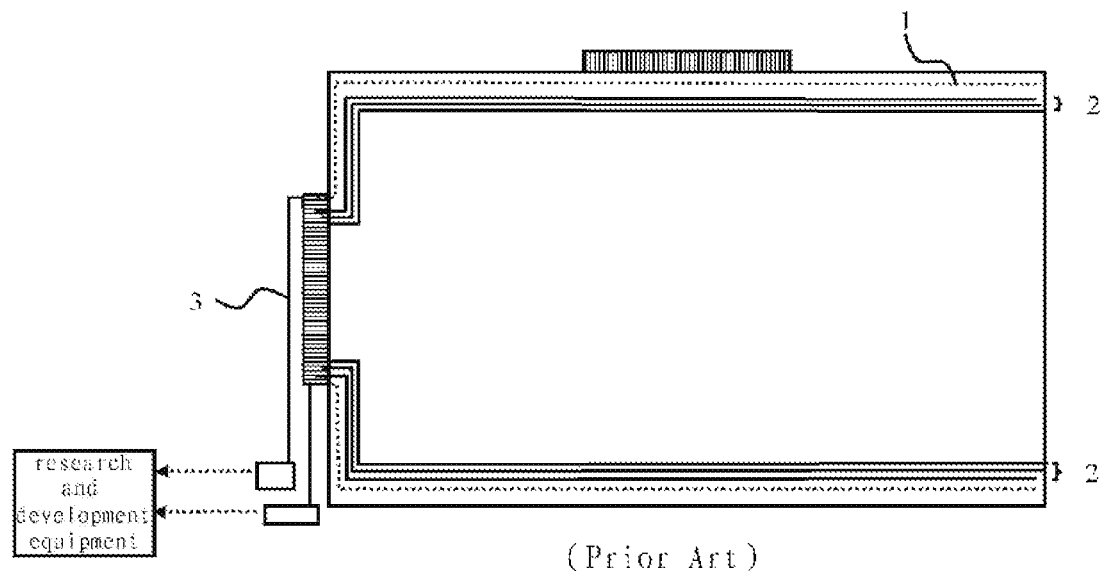
FIG. 1 is a general schematic view of a display panel in the prior art.

FIG. 1 schematically shows a wiring layout within a display panel, in which a dotted line 1 is a measured signal line, a solid line 2 is other signal lines within the display panel, and a solid line 3 is a test line. Generally, as shown in FIG. 1, the start point of the test line 3 is connected to the measured signal line 1, and the end point thereof is connected to research and development equipment via a test pad, so that the research and development equipment can monitor the voltage and current situation in the display panel via the test line.

Figure 2:
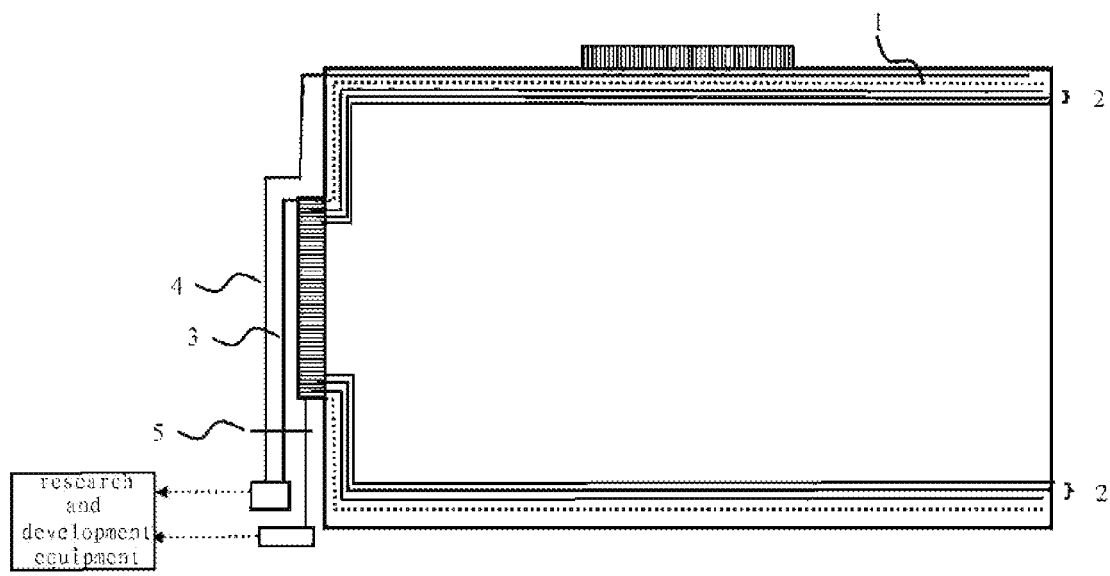
FIG. 2 is a schematic view of a display panel according to embodiments of the present disclosure.

FIG. 2 illustrates a display panel according to embodiments of the present disclosure, in which a dummy line 4 is arranged substantially parallel to a test line 3, and a horizontally extending signal line 5 overlaps the test line 3 and the dummy line 4. In the embodiment shown in FIG. 2, a measured signal line 1 may be a gate line and the signal line 5 may be a data line.

In order to limit the electrostatic discharge to the dummy line 4, the relative dimensions of the dummy line 4 and the test line 3 need to satisfy the condition that the ratio of the area of the overlapping region between the dummy line 4 and the signal line 5 to the area of the dummy line 4 should be smaller than the ratio of the area of the overlapping region between the test line 3 and the signal line (which is the gate line 5 here) to the area of the test line 3. In an exemplary embodiment, the ratio of the area of the overlapping region between the dummy line and the signal line to the area of the dummy line is at least 15% (e.g. 20% or more) smaller than the ratio of the area of the overlapping region between the test line and the signal line to the area of the test line.

In an example implementation, the area of the dummy line 4 is larger than or equal to the area of the test line 3, and the overlapping area between the dummy line 4 and the signal line 5 is smaller than the overlapping area between the test line 3 and the signal line 5. For example, the overlapping area between the dummy line 4 and the signal line 5 is at least 15% (e.g. 20% or more) smaller than the overlapping area between the test line 3 and the signal line 5.

Figure 3:
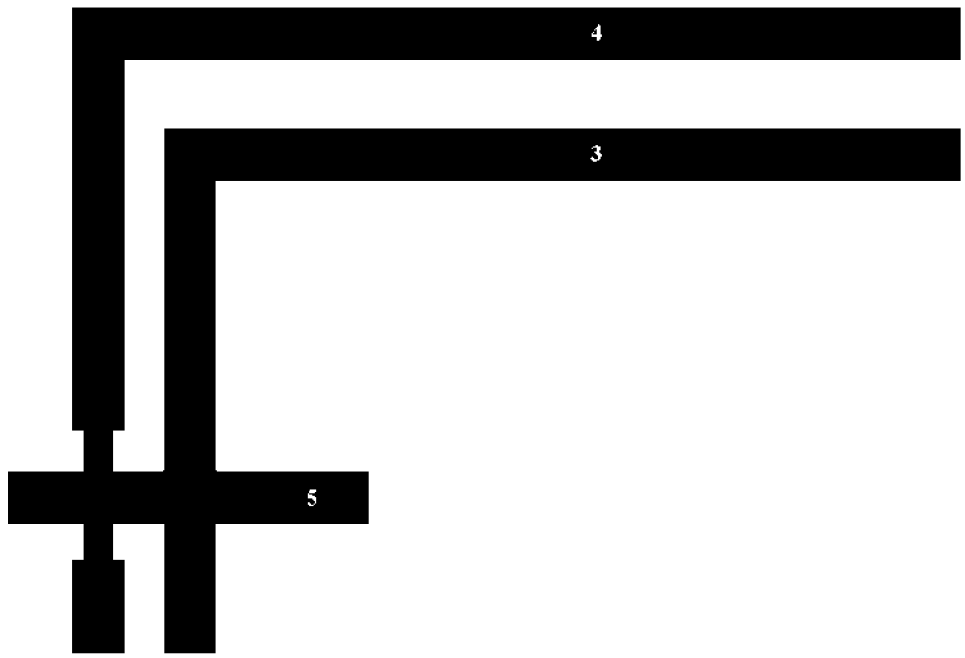
FIG. 3 is a schematic view showing arrangement of a dummy line according to an embodiment of the present disclosure.

As shown in FIG. 3, the width of the dummy line 4 in the overlapping region thereof with the signal line 5 is smaller than the width of the test line 3 in the overlapping region thereof with the signal line 5, and the width of the dummy line 4 in regions other than the overlapping region is equal to that of the test line 3. For example, the width of the dummy line 4 in the overlapping region thereof with the signal line 5 is at least 15% (e.g. 20% or more) smaller than the width of the test line 3 in the overlapping region thereof with the signal line 5.

In the embodiment shown in FIG. 3, the dummy line 4 may be equal in length to the test line 3. Since the area of the overlapping region between the dummy line 4 or the test line 3 and the signal line 5 is negligible as compared to the area of the dummy line 4 or the test line 3, it is considered that the dummy line 4 and the test line 3 have equal areas. The electrostatic discharge takes place preferentially on the dummy line 4.

In another example implementation, the area of the overlapping region between the dummy line 4 and the signal line 5 is smaller than or equal to the area of the overlapping region between the test line 3 and the signal line 5, and the area of the dummy line 4 is larger than the area of the test line 5.

Figure 4:
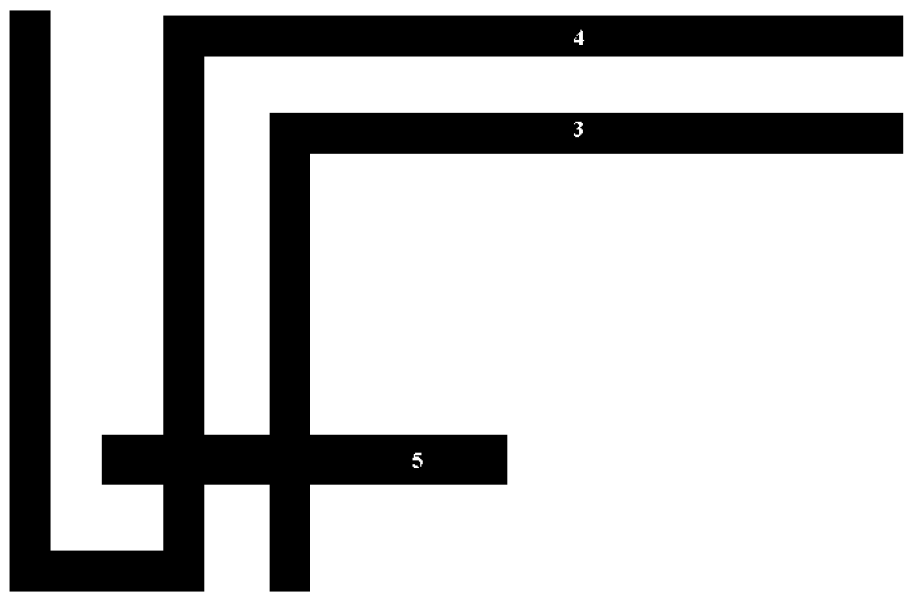
FIG. 4 is a schematic view showing arrangement of a dummy line according to another embodiment of the present disclosure.

As shown in FIG. 4, the width of the dummy line 4 is equal to that of the test line 3, and the length of the dummy line 4 is larger than that of the test line 3. For example, the length of the dummy line 4 is at least 15% larger than the length of the test line 3.

Figure 5:
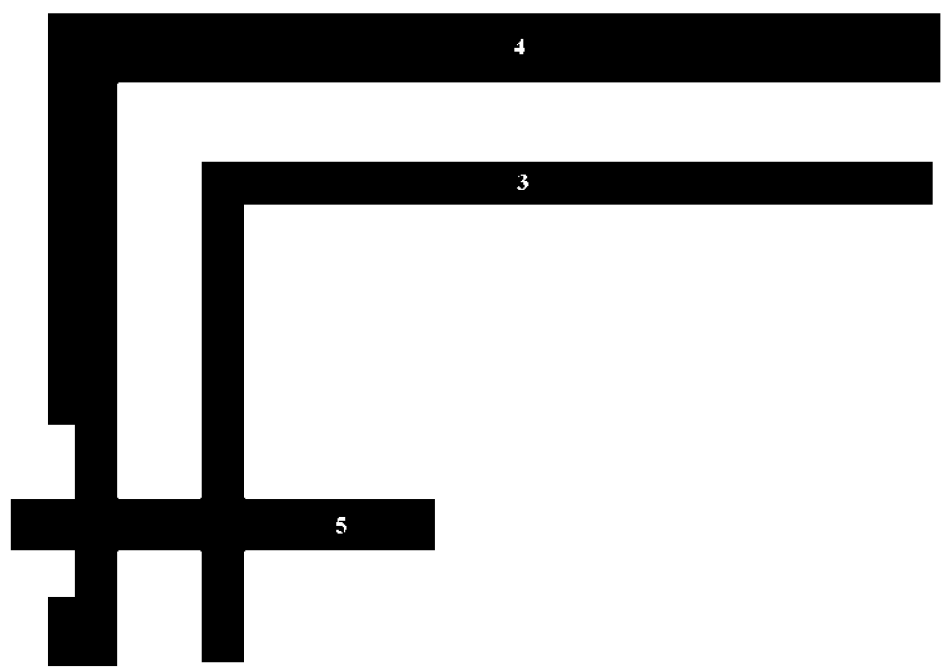
FIG. 5 is a schematic view showing arrangement of a dummy line according to a further embodiment of the present disclosure.

Alternatively, as shown in FIG. 5, the width of the dummy line 4 in the overlapping region thereof with the signal line 5 is smaller than the width of the test line 3 in the overlapping region thereof with the signal line 5, and the width of the dummy line 4 in regions other than the overlapping region is larger than that of the test line 3.

In the above-described embodiments, the signal line that overlaps the dummy line 4 and the signal line 5 may be any of the signal lines in the display panel, such as a gate line, a data line, or the like.

Embodiments of the present disclosure further provide a display device that may comprise a display panel in any of the embodiments described above.

In the above-described embodiments, not only the function of the test line can be retained, but also the problem of electrostatic discharge on the test line can be solved fundamentally, reducing the yield loss and the maintenance cost of the display panel. Meanwhile, by adding the design of a dummy line while designing the wiring mask of the display panel, it is possible to solve the problem of electrostatic discharge on the test line without significantly increasing the manufacturing complexity and the manufacturing cost, as compared with the solution of deploying a separate electrostatic protection circuit, which is advantageous to thinning and portability of the display panel.

The present disclosure can be widely applied to various display devices and apparatuses having a display device, such as a mobile phone, a notebook computer, a liquid crystal television, and the like.

Those skilled in the art will recognize that the present disclosure is in no way limited to the exemplary embodiments described above. On the contrary, many modifications and variations are possible within the scope of the appended claims. For example, other components may be added to or removed from the described device. Other embodiments may fall within the scope of the present disclosure. Furthermore, in the claims, the word "comprising" does not exclude other elements or steps. The mere fact that certain measures are recited in mutually different dependent claims does not indicate that a combination of these measures cannot be used to advantage.

The invention claimed is:

1. A display panel, comprising:
a first signal line;
a second signal line;
a test line connected to the first signal line and arranged to test a signal of the first signal line; and
a dummy line extending in a direction consistent with that of the test line and arranged to prevent occurrence of electrostatic discharge on the test line;
wherein the test line and the dummy line have an overlapping region with the second signal line, respectively, a ratio of an area of the overlapping region between the dummy line and the second signal line to an area of the dummy line is smaller than a ratio of an area of the overlapping region between the test line and the second signal line to an area of the test line, and the dummy line is not in electrical connection with the test line, the first signal line, and the second signal line, and
wherein the first signal line is a gate line and the second signal line is a data line.

2. The display panel according to claim 1, wherein the ratio of the area of the overlapping region between the dummy line and the second signal line to the area of the dummy line is at least 15% smaller than the ratio of the area of the overlapping region between the test line and the second signal line to the area of the test line.

3. The display panel according to claim 2, wherein the ratio of the area of the overlapping region between the dummy line and the second signal line to the area of the dummy line is 20% smaller than the ratio of the area of the overlapping region between the test line and the second signal line to the area of the test line.

4. The display panel according to claim 1, wherein the area of the dummy line is larger than or equal to the area of the test line, and an overlapping area between the dummy line and the second signal line is smaller than an overlapping area between the test line and the second signal line.

5. The display panel according to claim 4, wherein the overlapping area between the dummy line and the second signal line is at least 15% smaller than the overlapping area between the test line and the second signal line.

6. The display panel according to claim 1, wherein a width of the dummy line in the overlapping region thereof with the second signal line is smaller than a width of the test line in the overlapping region thereof with the second signal line, and a width of the dummy line in regions other than the overlapping region is larger than or equal to that of the test line.

7. The display panel according to claim 6, wherein the dummy line is equal in length to the test line.

8. The display panel according to claim 1, wherein the area of the overlapping region between the dummy line and the second signal line is smaller than or equal to the area of the overlapping region between the test line and the second signal line, and the area of the dummy line is larger than the area of the test line.

9. The display panel according to claim 1, wherein the width of the dummy line is equal to that of the test line, and a length of the dummy line is larger than that of the test line.

10. The display panel according to claim 9, wherein the length of the dummy line is at least 15% larger than that of the test line.

11. The display panel according to claim 1, wherein the dummy line is parallel to and similar in shape to the test line.

12. A display device, comprising the display panel according to claim 1.

13. The display device according to claim 12, wherein the ratio of the area of the overlapping region between the dummy line and the second signal line to the area of the dummy line is at least 15% smaller than the ratio of the area of the overlapping region between the test line and the second signal line to the area of the test line.

14. The display device according to claim 13, wherein the ratio of the area of the overlapping region between the dummy line and the second signal line to the area of the dummy line is 20% smaller than the ratio of the area of the overlapping region between the test line and the second signal line to the area of the test line.

15. The display device according to claim 12, wherein the area of the dummy line is larger than or equal to the area of the test line, and an overlapping area between the dummy line and the second signal line is smaller than an overlapping area between the test line and the second signal line.

16. The display device according to claim 15, wherein the overlapping area between the dummy line and the second signal line is at least 15% smaller than the overlapping area between the test line and the second signal line.

17. The display device according to claim 12, wherein a width of the dummy line in the overlapping region thereof with the second signal line is smaller than a width of the test line in the overlapping region thereof with the second signal line, and a width of the dummy line in regions other than the overlapping region is larger than or equal to that of the test line.

18. The display device according to claim 17, wherein the dummy line is equal in length to the test line.

* * * * *